US006433375B1

(12) United States Patent
Carlsson et al.

(10) Patent No.: US 6,433,375 B1
(45) Date of Patent: Aug. 13, 2002

(54) TUNABLE MICROWAVE DEVICES

(75) Inventors: Erik Carlsson, Mölndal; Peter Peirov, Göteborg, both of (SE); Orest Vendik, S. Petersburg (RU); Erland Wikborg, Danderyd; Zdravko Ivanov, Göteborg, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/548,161

(22) Filed: Apr. 13, 2000

(30) Foreign Application Priority Data

Apr. 13, 1999 (SE) ............................................. 9901297

(51) Int. Cl.[7] .......................... H01L 29/76; H01L 29/93

(52) U.S. Cl. ....................... 257/295; 257/295; 257/595; 365/145; 361/280; 361/281; 361/282

(58) Field of Search ................................ 257/595, 295; 365/145; 361/280, 281, 282

(56) References Cited

U.S. PATENT DOCUMENTS 5,155,658 A * 10/1992 Inam et al. ................. 361/321
5,270,298 A * 12/1993 Ramesh ......................... 505/1
5,524,092 A 6/1996 Park
5,578,845 A * 11/1996 Masuda et al. ............. 257/295
5,578,846 A * 11/1996 Evan, Jr. et al. ............ 257/295
5,640,042 A 6/1997 Koscica et al.
6,097,047 A * 8/2000 Ooms et al. ................ 257/295
6,111,284 A * 8/2000 Sakurai ...................... 257/310
6,151,240 A * 11/2000 Suzuki ....................... 365/145

FOREIGN PATENT DOCUMENTS

EP 518117 12/1992
EP WO-00/426643 * 7/2000
WO 9413028 6/1994

* cited by examiner

*Primary Examiner*—Jerome Jackson, Jr.
*Assistant Examiner*—Joseph Nguyen
(74) *Attorney, Agent, or Firm*—Burns, Doane, Swecker & Mathis, L.L.P.

(57) ABSTRACT

An electrically tunable device, particularly for microwaves, includes a carrier substrate, conductors, and at least one tunable ferroelectric layer. Between the conductors and the tunable ferroelectric layer, a buffer layer including a thin film structure having a non-ferroelectric material is arranged.

20 Claims, 3 Drawing Sheets

TUNABLE MICROWAVE DEVICES

This application claims priority under 35 U.S.C. §§119 and/or 365 to Application No. 9901297-3 filed in Sweden on Apr. 13, 1999; the entire content of which is hereby incorporated by reference.

BACKGROUND

The present invention relates to electrically tunable devices particularly for microwaves, which are based on a ferroelectric structure.

Known electrically tunable devices, such as capacitors (varactors) and which are based on ferroelectric structures do indeed have a high tuning range but the losses at microwave frequencies are high thus limiting their applicability. Typical ratios between the maximum and the minimum values of the dielectric constant (without and with applied electric fields) ranges from n=1.5 to 3 and the loss tangents ranges from 0.02 to 0.05 at 10 GHz. This is not satisfactory for microwave applications requiring a low loss. Then e.g. a quality factor of about 1000-2000 is needed. WO 94/13028 discloses a tunable planar capacitor with ferroelectric layers. However, the losses are high at microwave frequencies.

U.S. Pat. No. 5,640,042 shows another tunable varactor. Also in this case the losses are too high Losses across the interface dielectric material-conductor are produced which are high and furthermore the free surface between the conductors results in the ferroelectric material being exposed during processing (e.g. etching, patterning) which produce losses since the crystal structure can be damaged.

SUMMARY

What is needed is therefore a tunable microwave device having a high turning range in combination with low losses at microwave frequencies. A device is also needed which has a quality factor at microwave frequencies such as for example up to 1000-2000. A device is also needed in which the ferroelectric layer is stabilized and a device which shows a performance which is stable with the time, i.e. the performance does not vary and become deteriorated with time.

Furthermore a device is needed which is protected against avalanche electric breakdown in the tunable ferroelectric material.

Further yet a device is needed which is easy to fabricate. A device is also needed which is insensitive to external factors as temperature, humidity etc. Therefore an electrically tunable device, particularly for microwaves, is provided which comprises a carrier substrate, conducting means and at least one tunable ferroelectric layer. Between the/each (or at least a number of) conducting means and a tunable ferroelectric layer a buffer layer structure is provided which comprises a thin film structure comprising a non-ferroelectric material.

According to one embodiment the thin film structure comprises a thin non-ferroelectric layer. In an alternative embodiment the thin film structure comprises a multi-layer structure including a number of non-ferroelectric layers. In still further embodiments a multilayer structure including a number of non-ferroelectric layers arranged in an alternating manner with ferroelectric layers (such that a non-ferroelectric layer always is provided adjacent the/a conducting means.

In a particular embodiment the ferroelectric layer is arranged on top of the carrier substrate and the non-ferroelectric thin film structure, including one or more layers, is arranged on top of the ferroelectric layer the conducting means in turn being arranged on top of the non-ferroelectric structure. In an alternative embodiment the ferroelectric layer is arranged above the non-ferroelectric structure including one or more non-ferroelectric layers, which is arranged on top of the conducting means. The conducting means particularly comprise (at least) two longitudinally arranged electrodes between which electrodes or conductors a gap is provided. According to different embodiments the non-ferroelectric structure is deposited in-situ on the ferroelectric layer or deposited ex-situ on the ferroelectric layer.

The deposition of the non-ferroelectric layer may be performed using different techniques such as for examples laser deposition, sputtering, physical or chemical vapour deposition or through the use of sol-gel techniques. Of course also other techniques which are suitable can be used.

Advantageously the ferroelectric and the non-ferroelectric structures have lattice matching crystal structures. The non-ferroelectric structure is particularly arranged so as to cover also the gap between the conductors or the electrodes. In a particular implementation the device comprises an electrically tunable capacitor or a varactor.

In another embodiment the device includes two layers of ferroelectric material provided on each side of the carrier substrate and two conducting means, non-ferroelectric thin film structures being arranged between the respective ferroelectric and non-ferroelectric structures in such a way that the device forms a resonator. According to different implementations the device of the invention may comprise microwave filters or be used in microwave filters. Also devices such as phase shifters etc. can be provided using the inventive concept.

Different materials can be used; one example of a ferroelectric material is STO ($SrTiO_3$). The non-ferroelectric material may for example comprise $CeO_2$ or a similar material or $SrTiO_3$ which is doped in a such a way that it is not ferroelectric. An advantageous use of a device as disclosed is in wireless communication systems.

BRIEF DESCRIPTION OF THE DRAWINGS

The invention will in the following be further described in a non-limiting way and with reference to the accompanying drawings in which.

DETAILED DESCRIPTION

Through the invention devices are disclosed through which it is possible, to achieve a high tunability in combination with low losses at microwave frequencies. In general terms this is achieved through a design in which a thin non-ferroelectric, dielectric layer (or layers) is (are) arranged between the conducting layer and a tunable ferroelectric layer. The non-ferroelectric layer will also act as a cover for the ferroelectric layer in the gap between the conducting means or the electrodes. The non-ferroelectric layer can be deposited "in-situ" or "ex-situ" on the ferroelectric layer by laser deposition, sputtering, physical vapour deposition, chemical vapour deposition, sol-gel or any other convenient technique. The non-ferroelectric layer should be oriented and have a good lattice match to the crystal structure of the ferroelectric layer. Further it should have low microwave losses. In all embodiments as referred to below or not explicitly disclosed, the non-ferroelectric layer structure may be a single layered structure or it may comprise a multilayered structure.

The thin non-ferroelectric structure will reduce the total capacitance of the device due to the presence of two capacitances of the thin non-ferroelectric structures in series with the tunable capacitance resulting from the ferroelectric layer. Even if the total capacitance is reduced, which is wanted in most applications, the tunability will only decrease slightly since the change in the dielectric constant of the ferroelectric layer will redistribute the electric field and change the series capacitances due to the thin non-ferroelectric structure.

Figure 1:
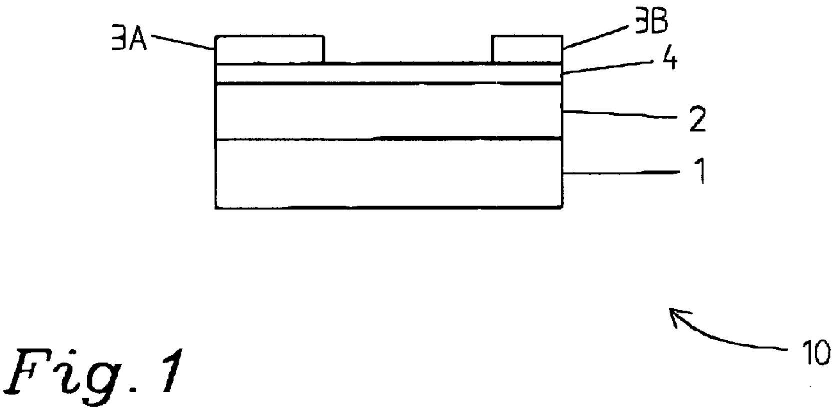
FIG. 1 shows a cross-sectional view of a tunable device according to a first embodiment of the invention, FIG. 2 schematically illustrates a planar capacitor similar to the embodiment of FIG. 1.

FIG. 1 shows a first embodiment of a device 10 according to the invention which comprises a substrate 1 or which a ferroelectric material 2, which is tunable, is provided. On said tunable ferroelectric material 2, a non-ferroelectric layer 4 is deposited, for example using any of the techniques as referred to above. Two conducting means comprising a first conductor or electrode 3A and a second conductor or electrode 3B are arranged on the non-ferroelectric layer 4. Between the first and second electrodes 3A, 3B there is a gap. As can be seen from the figure the non-ferroelectric structure 4 covers the tunable ferroelectric structure 2 across the gap between the conductors 3A, 3B. The surface of the ferroelectric structure 4 is thus protected by the non-ferroelectric structure a in a finished state but also during processing, i.e. when the device is fabricated. Since the ferroelectric structure 2 is protected in this manner, the ferroelectric structure will be stabilized and its performance will be stable with the time, i.e. it does not deteriorate with the time. Furthermore the losses will decrease since there will be a higher control of the interface of the ferroelectric structure and there will be less defects on the surface layer of the ferroelectric material. Instead of two electrodes, the conducting means may include more than two electrodes e.g. one or more electrodes provided between the electrodes 3A, 3B.

Furthermore the non-ferroelectric layer will provide a protection against avalanche electric breakdown in the tunable ferroelectric material.

Although the non-ferroelectric structure 4 is shown as comprising a merely one layer, it should be clear that it also may comprise a multilayer structure.

Figure 2:
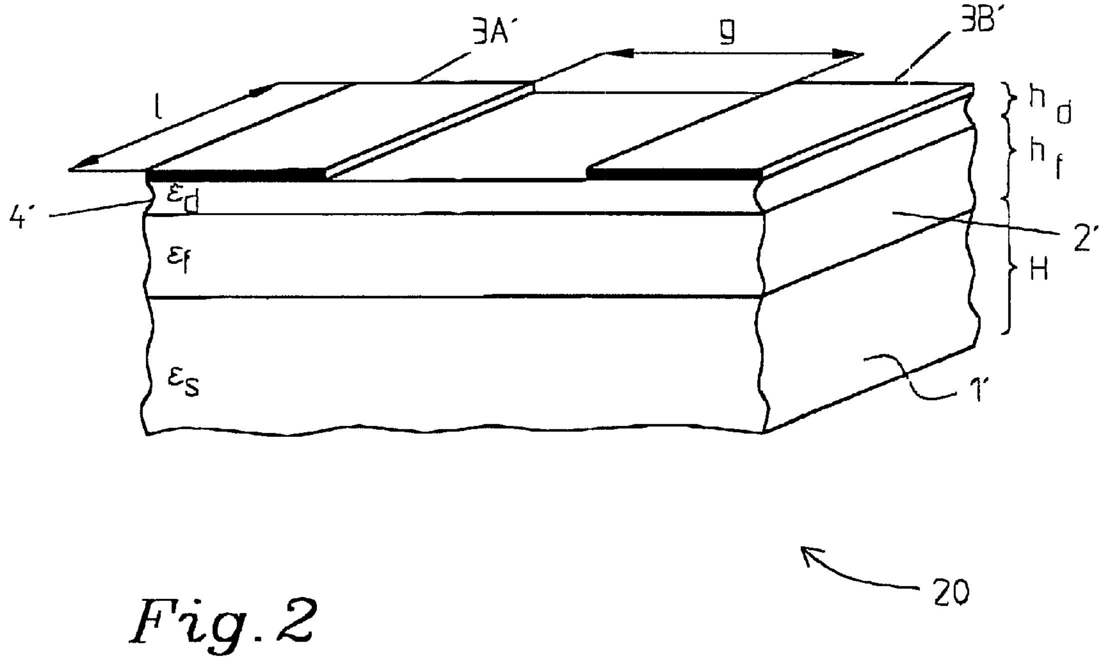

FIG. 2 shows an embodiment relating to a planar capacitor 20. Relating to this embodiment some figures are given relating to dimensions, values etc. which here of course only are given for illustrative purposes. The device includes a substrate 1' for example of $LaAlO_3$ having a thickness H of for example 0.5 mm, and with a dielectric permittivity $\epsilon_s$=25. On top of the substrate a ferroelectric layer 2' for example of STO is arranged which here has a thickness $h_f$ of 0.25 $\mu$m and with a dielectric permittivity $\epsilon_f$=1500. Thereon the protective buffer layer 4', which is a non-ferroelectric e.g. dielectric layer, is arranged having a dielectric permittivity $\epsilon_d$=10.

Figure 3:
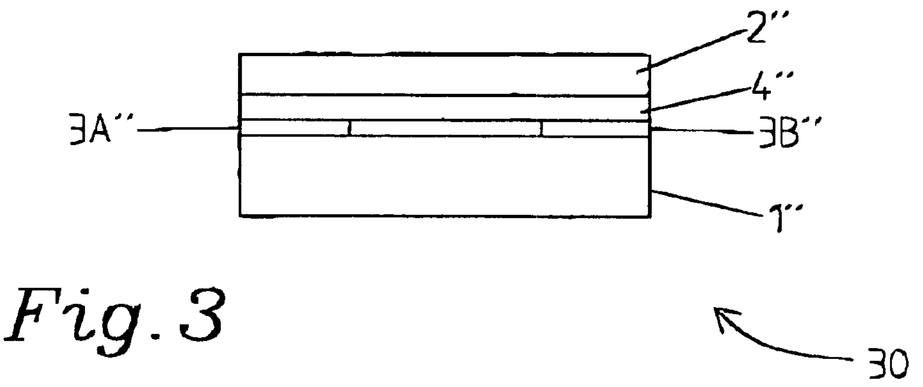
FIG. 3 shows a second embodiment of an inventive device.

In FIG. 3 an alternative device 30 is disclosed in which a non-ferroelectric structure 4", here comprising a multiple of sublayers, are arranged on top of conducting electrodes, 3A', 3B' which are arranged on substrate 1". The non-ferroelectric multilayer structure is deposited on (below) a tunable ferroelectric material 2". The functioning is substantially the same as that as described with reference to FIG. 1, only it is an invented structure as the ferroelectric is arranged above the non-ferroelectric layer, i.e. above the electrodes. Furthermore the non-ferroelectric layer comprises a multilayer structure. Of course in this embodiment the non-ferroelectric structure may alternatively comprise a single layer.

Figure 4:
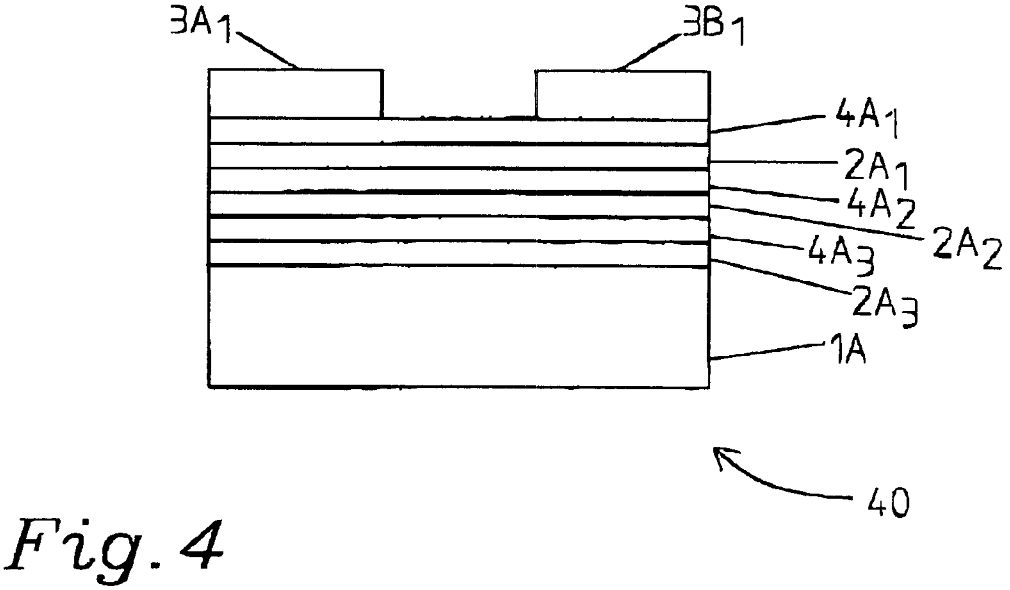
FIG. 4 shows still another embodiment in which a structure comprising alternating layers is used.

FIG. 4 shows a tunable capacitor 40 in which a structure comprising ferroelectric layers 2A$_1$, 2A$_2$, 2A$_3$ and non-ferroelectric layers 4A$_1$, 4A$_2$, 4A$_3$ which are arranged in an alternating manner. The number of layers can of course be any and is not limited to three of each kind as illustrated in FIG. 4, the main thing being that a non-ferroelectric layer (here 4A$_1$) is arranged in contact with the conducting means 3A$_1$, 3B$_1$; also covering a ferroelectric layer (here 2A$_1$) in the gap between the electrodes.

Such an alternating arrangement can of course also be used in the "inverted" structure as disclosed in FIG. 3.

Figure 5:
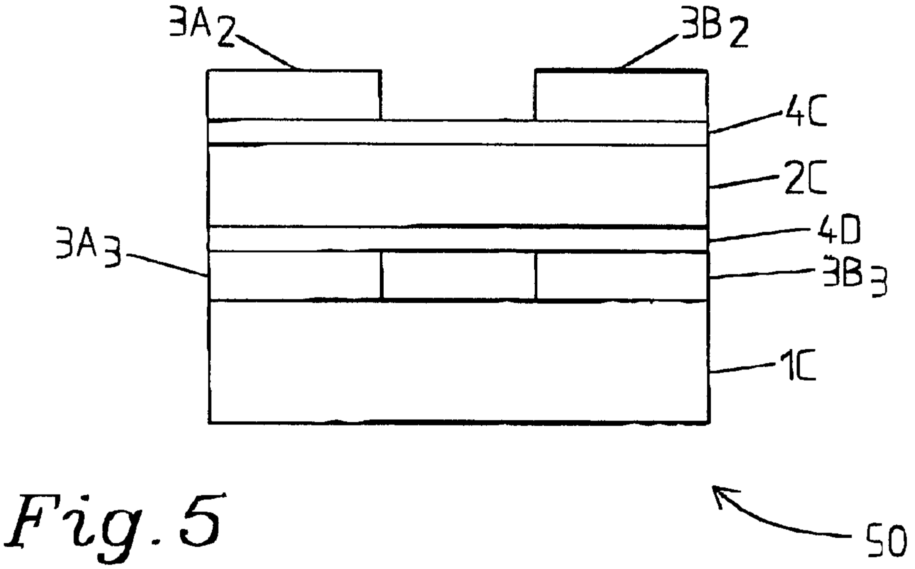
FIG. 5 illustrates a fourth embodiment of a device according to the invention, FIG. 6 schematically illustrates an experimental dependence of the tunability as a function of the capacitance for a number of material thicknesses.

FIG. 5 shows yet another device 50 in which first conducting means 3A$_2$, 3B$_2$ in the form of electrodes are arranged on a non-ferroelectric layer 4C, which in turn is deposited on a ferroelectric, active, layer 2C. Below the ferroelectric layer 2C a further non-ferroelectric layer 4D is provided on the opposite side of which second conducting means 3A$_3$, 3B$_3$ are arranged, which in turn are arranged on a substrate 1C. Also in this case may an alternating structure as in FIG. 4 be used.

Any of the materials mentioned above can be used also in these implementations. The non-ferroelectric material can be dielectric, but it does not have to be such a material. Still further it may be ferromagnetic.

The active ferroelectric layer structure of any embodiment may for example comprise any of $SrTiO_3$, $BaTiO_3$, $Ba_xSr_{1-x}TiO_3$, PZT (Lead Zirconate Titanate) as well as ferromagnetic materials. The buffer layer or the protective non-ferroelectric structure may e.g. comprise any of the following materials: $CeO_2$, MgO, YSZ (Ytterium Stabilized Zirconium), $LaAlO_3$ or any other non-conducting material with an appropriate crystal structure, for example PrBCO ($PrBa_2CU_3O_{7-x}$), non-conductive $YBa_2Cu_3O_{7-x}$ ect. The substrate may comprise $LaAlO_3$, MgO, R-cut or M-cut sapphire, $SiSrRuO_3$ or any other convenient material. It should be clear that the lot of examples is not exhaustive and that also other possibilities exist.

Figure 6:
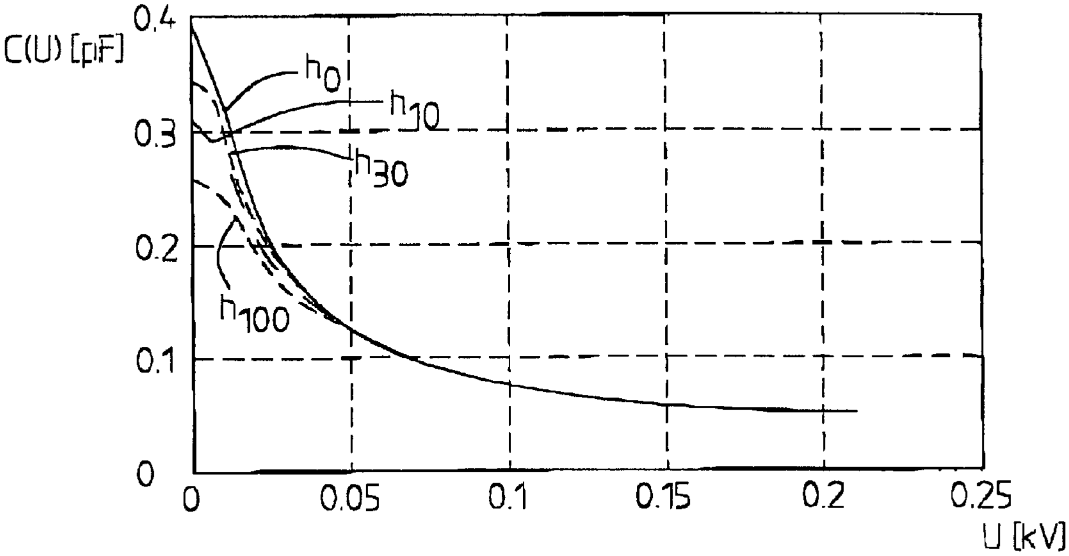

In FIG. 6 the dynamic capacitance is illustrated as a function of the voltage for three different thicknesses of the non-ferroelectric buffer layer 4' which here is dielectric. In this case the length of the planar capacitor is supposed to be 0.5 mm whereas the gap between the conductors 3A', 3B' is 4 $\mu$m. A magnetic wall can be said to be formed between the substrate and the ferroelectric layer 2'.

The capacitance is illustrated as a function of the voltage applied between the electrodes for three different values, namely $h_{10}$=10 nm, $h_{30}$=30 mm and $h_{100}$=100 nm of the dielectric non-ferroelectric buffer layer 4'. The capacitance is also illustrated for the case when there is no buffer layer between the conducting means and the ferroelectric layer, curve $h_0$. This is thus supposed to illustrate how the tunability is reduced through the introduction of a buffer layer 4' for a number of thicknesses as compared to the case when there is no buffer layer. As can be seen the reduction in tunability is not significant.

Figure 7:
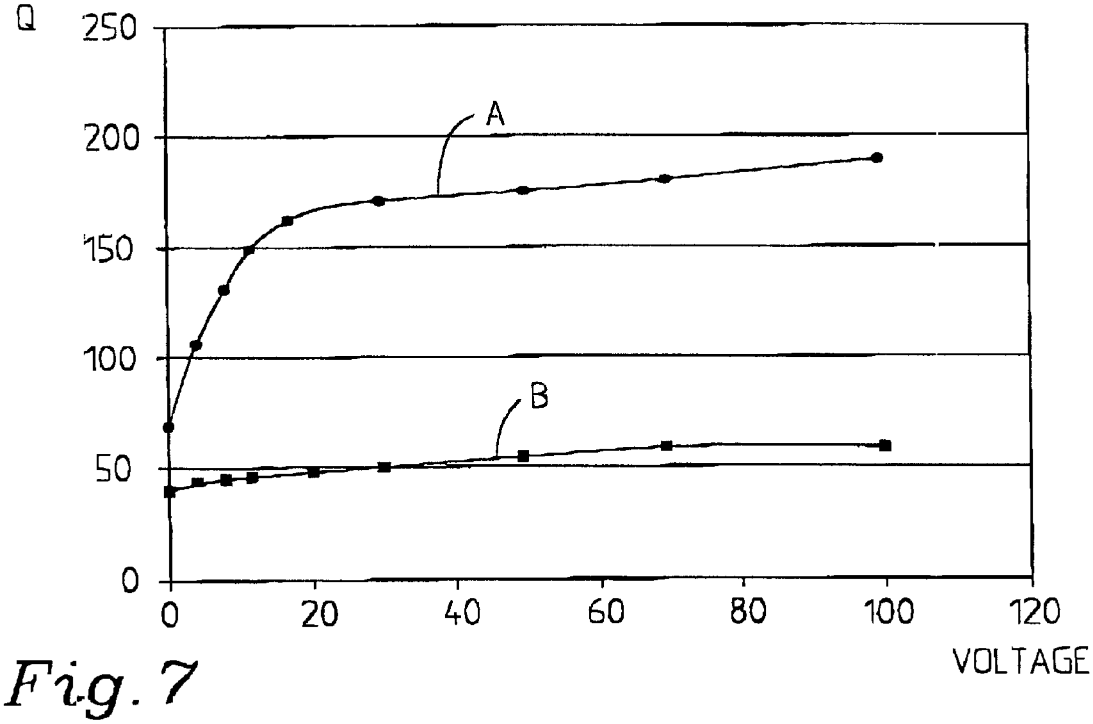
FIG. 7 shows the experimental results relating to the loss factor when using a non-dielectric layer according to the invention.

FIG. 7 shows the Q value for a capacitance depending on voltage when a buffer layer is provided, corresponding to the upper curve A, and the case when there is no buffer layer, corresponding to the lower curve B. Thus, as can be seen from the experimental behavior, the Q value for a capacitor is considerably increased through the introduction of a buffer layer.

In addition to the advantages as already referred to above, it is an advantage in using a buffer layer across the active (tunable) ferroelectric layer since when a conductive pattern is etched, some etching will also occur in the subsequent, underlying, layer. Thus damages may be produced in the top layer of the ferroelectric material in the gap if it is not protected.

The inventive concept can also be applied to resonators, such as for example the ones disclosed in "Tunable Microwave Devices" which is a Swedish patent application with application No. 9502137-4, by the same applicant, which hereby is incorporated herein by reference. The inventive concept can also be used in microwave filters of different kinds. A number of other applications are of course also possible. As in other aspects the invention is not limited to the particularly illustrated embodiments but can be varied in a number of ways within the scope of the claims.

What is claimed is:

1. An electrically tunable device, comprising a carrier substrate, conducting means, at least two active ferroelectric layers, and a plurality of thin film structures each comprising a non-ferroelectric material, wherein the film structures are arranged between the conducting means and a first one of the ferroelectric layers and alternating between each of the ferroelectric layers, the ferroelectric layers and the thin film structures having lattice matching crystal structures.

2. The device according to claim 1, wherein the thin film structure comprises a thin non-ferroelectric layer.

3. The device according to claim 1, wherein the thin film structure comprises a multi-layer structure including a number of non-ferroelectric layers.

4. The device according to claim 1, wherein the first ferroelectric layer is arranged on top of the carrier substrate, one of the non-ferroelectric thin film structures being arranged on top of the first ferroelectric layer, and the conducting means are arranged on top of a last one of the alternating non-ferroelectric structures.

5. The device according to claim 1, wherein the first ferroelectric layer is arranged above one of the non-ferroelectric thin film structures, which is arranged on top of the conducting means being arranged on the substrate.

6. The device according to claim 1, wherein the conducting means comprise two longitudinally arranged electrodes between which a gap is provided.

7. The device according to claim 1, wherein second conducting means are provided, and a non-ferroelectric layer is arranged between said second conducting means and the ferroelectric layers.

8. The device according to claim 1, wherein the non-ferroelectric layer structure is a buffer layer deposited insitu on the ferroelectric layer.

9. The device according to claim 1, wherein the non-ferroelectric layer structure is a buffer layer deposited exsitu on the ferroelectric layer.

10. The device according to claim 6, wherein the non-ferroelectric buffer layer structure is deposited through the use of laser deposition, sputtering, physical or chemical vapor deposition or sol-gel techniques.

11. The device according to claim 7, wherein the non-ferroelectric buffer layer structure is deposited through the use of laser deposition, sputtering, physical or chemical vapor deposition or sol-gel techniques.

12. The device according to claim 6, wherein the non-ferroelectric buffer layer structure is arranged to cover the gap between the conductors/electrodes.

13. The device according to claim 1, wherein the device is arranged as an electrically tunable capacitor.

14. The device according to claim 7, wherein the device is arranged to form a resonator.

15. The device according to claim 1, wherein the non-ferroelectric material is a dielectricum.

16. The device according to claim 1, wherein the non-ferroelectric material is ferromagnetic.

17. The device according to claim 1, wherein it is used in microwave filters.

18. The device according to claim 1, wherein the ferroelectric material comprises STO ($SrTiO_3$).

19. The device according to claim 1, wherein the non-ferroelectric material comprises $CeO_2$ or a similar material $SrTiO_3$ doped in such a way that it is not ferroelectric.

20. The device of claim 1, wherein it is used in a wireless communication system.

* * * * *